(12) United States Patent
Lai et al.

(10) Patent No.: US 9,927,849 B1
(45) Date of Patent: Mar. 27, 2018

(54) APPARATUS FOR COVERING CONNECTION PORT ASSEMBLY

(71) Applicant: GIGA-BYTE TECHNOLOGY CO., LTD., New Taipei (TW)

(72) Inventors: Chih-Ming Lai, New Taipei (TW); Tzu-Hsiang Huang, New Taipei (TW); Yung-Shun Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/655,877

(22) Filed: Jul. 20, 2017

(30) Foreign Application Priority Data

May 26, 2017 (TW) ............................. 106117742 A (51) Int. Cl.
*G06F 1/16* (2006.01)
*G06F 1/18* (2006.01)

(52) U.S. Cl.
CPC .................................. *G06F 1/182* (2013.01)

(58) Field of Classification Search
CPC ........ G06F 1/181; G06F 1/182; G06F 1/1656; G06F 1/1658
See application file for complete search history.

(56) References Cited

U.S. PATENT DOCUMENTS

| | | | | |
|---|---|---|---|---|
| 4,977,532 A * | 12/1990 | Borkowicz | ............... | G06F 1/18 361/741 |
| 5,650,911 A * | 7/1997 | Scholder | ................. | G06F 1/183 361/679.4 |
| 5,684,271 A * | 11/1997 | Scholder | ................. | G06F 1/182 174/382 |
| 5,783,771 A * | 7/1998 | Copeland | ............. | H05K 9/0073 174/365 |
| 5,808,237 A * | 9/1998 | Hancock | .............. | H05K 9/0049 174/378 |
| 5,822,182 A * | 10/1998 | Scholder | ................. | G06F 1/183 361/679.57 |
| 6,166,325 A * | 12/2000 | Wu | ...................... | H05K 9/0039 174/377 |
| 6,239,358 B1 * | 5/2001 | Chang | .................... | G06F 1/182 174/354 |
| 6,252,160 B1 * | 6/2001 | Chang | ................. | H05K 9/0016 174/377 |

(Continued)

*Primary Examiner* — Anthony Q Edwards
(74) *Attorney, Agent, or Firm* — Idea Intellectual Limited; Margaret A. Burke; Sam T. Yip (57) ABSTRACT

An apparatus for covering a connection port assembly is disposed on a motherboard, and includes a door frame and a shielding plate. The door frame includes two support members, a connecting member, and a latch on the connecting member. A fixed end of each support members is fixed on the motherboard. Connecting ends of the two support members are connected to the connecting member to define an accommodating area for disposing the connection port assembly. The shielding plate includes an upper flange and a plate body. The plate body has one or more opening, an upper edge, and a lower edge. A signal connection surface of the connection port assembly is exposed via the opening. The upper flange is extending from the upper edge and has a latch hole. The latch is engaged into the latch hole to fix the shielding plate to the door frame.

10 Claims, 12 Drawing Sheets

(56) References Cited

U.S. PATENT DOCUMENTS

| | | | | |
|---|---|---|---|---|
| 6,307,756 B1* | 10/2001 | Liu | .................... | H01R 13/6582 |
| | | | | 361/816 |
| 6,515,871 B1* | 2/2003 | Stark | ...................... | H05K 5/026 |
| | | | | 174/365 |
| 6,704,205 B1* | 3/2004 | Chen | ....................... | G06F 1/184 |
| | | | | 211/41.17 |
| 7,411,784 B2* | 8/2008 | Coglitore | ............. | H05K 9/0018 |
| | | | | 361/679.41 |
| 7,492,610 B2* | 2/2009 | Gilliland | ............. | H05K 9/0041 |
| | | | | 174/350 |
| 7,606,044 B2* | 10/2009 | Bailey | ..................... | G06F 1/182 |
| | | | | 361/752 |
| 7,744,172 B2* | 6/2010 | Chen | ....................... | G06F 1/183 |
| | | | | 312/223.2 |
| 8,141,963 B2* | 3/2012 | Chen | .................... | H05K 9/0018 |
| | | | | 312/223.2 |
| 2005/0265003 A1* | 12/2005 | Coglitore | ................ | G06F 1/182 |
| | | | | 361/724 |
| 2007/0035934 A1* | 2/2007 | Jiang | ...................... | G06F 1/185 |
| | | | | 361/759 |
| 2008/0049411 A1* | 2/2008 | Wang | ...................... | G06F 1/181 |
| | | | | 361/818 |
| 2010/0033918 A1* | 2/2010 | Du | ......................... | G06F 1/181 |
| | | | | 361/679.33 |

* cited by examiner

APPARATUS FOR COVERING CONNECTION PORT ASSEMBLY

CROSS-REFERENCES TO RELATED APPLICATIONS

This non-provisional application claims priority claim under 35 U.S.C. § 119(a) on Taiwan Patent Application No. 106117742 filed May 26, 2017, the entire contents of which are hereby incorporated by reference.

FIELD OF THE INVENTION

The instant disclosure relates to a backboard of a connection port assembly, in particular, to a connection port assembly integrated onto a motherboard.

BACKGROUND OF THE INVENTION

A window portion is premade on the back of the computer chassis to correspond to a connection port assembly on the motherboard, so that the connection port assembly is exposed via the window portion. The connection port assembly includes several connection ports, and the gaps between the connection ports have to be covered. As a result, an additional shielding plate corresponding to the connection port assembly is assembled on the window portion. The shielding plate covers the gaps between the connection ports, and the connection ports are via corresponding openings on the shielding plate. The shielding plate is a detachable structure. For different connection port assembly, different shielding plates are assembled onto the computer chassis.

SUMMARY OF THE INVENTION

In one embodiment, the apparatus is disposed on a motherboard for covering a connection port assembly. The motherboard has a top surface and a bottom surface. The connection port assembly has a signal connection surface. The connection port assembly is disposed on an edge of the top surface of the motherboard. The signal connection surface faces outwardly in a horizontal direction of the motherboard. The apparatus comprises a door frame and a shielding plate. The door frame is disposed on the motherboard. The door frame comprises two support members, a connecting member, and a latch. Each of the support members has a fixed end and a connecting end. The fixed ends of the support members are fixed on the top surface of the motherboard and correspond to two lateral edges of the signal connection surface, so that the connection port assembly is located between the two support members. The connecting member is connected to the connecting ends of the two support members. The two support members, the connecting member, and the motherboard define an accommodating area at an edge portion of the motherboard. The connection port assembly is located within the accommodating area. The latch is disposed on the connecting member. The shielding plate comprises a plate body and an upper flange. The plate body is for covering the signal connection surface. The plate body has at least one opening, an upper edge, and a lower edge. At least part of the signal connection surface is exposed via the opening. The lower edge corresponds to the edge portion of the motherboard. The upper flange is extending from the upper edge and the upper flange has a latch hole. The latch of the connecting member is provided for being engaged in the latch hole, so that the shielding plate can be fixed on the motherboard.

In one embodiment, the latch is on a lower surface of the connecting member. The upper edge is flush with the lower surface of the connecting member. The upper flange is extending toward the accommodating area. The upper flange is fixed on the lower surface of the connecting member via the latch and the latch hole.

In one embodiment, the latch is on an upper surface of the connecting member. The upper edge is flush with the upper surface of the connecting member. The upper flange is extending from the upper surface of the connecting member, and the upper flange is fixed on the upper surface of the connecting member via the latch and the latch hole.

In one embodiment, the latch is an engaging block having a guiding bevel facing outwardly.

In one embodiment, the latch is a pillar for inserting into the latch hole.

In one embodiment, the shielding plate further has a lower flange extending from the lower edge. The lower flange is fixed on the motherboard directly or indirectly.

In one embodiment, the lower flange has at least one fixing hole. The motherboard has a through hole corresponding to the fixing hole. The apparatus further comprises a fixing member. The fixing member passes through the fixing hole of the lower flange and the through hole of the motherboard to fix the lower flange on the top surface or the bottom surface of the motherboard.

In one embodiment, the lower flange has at least one fixing hole. The apparatus further comprises a fixing member and a separating pillar. The separating pillar is disposed on the bottom surface of the motherboard. The fixing member passes through the fixing hole of the lower flange to be fixed on the separating pillar, so that the fixing member indirectly fixes the lower flange on the bottom surface of the motherboard.

In one embodiment, the lower flange has at least one fixing hole. The apparatus further comprises a fixing member and a reinforcing plate. The reinforcing plate is fixed on the bottom surface of the motherboard. The fixing member passes through the fixing hole of the lower flange to be fixed on the reinforcing plate, so that the fixing member indirectly fixes the lower flange on the bottom surface of the motherboard.

In one embodiment, the connecting member has a window portion. The apparatus further comprises a light source. The light source is disposed on the lower surface of the connecting member and corresponds to the window portion.

According to embodiments of the instant disclosure, the apparatus for covering connection port assembly is directly integrated onto the motherboard without an additional separated I/O shielding plate. In other words, openings are premade for the backboard of the computer chassis and no additional shielding plate is required. Therefore, the problem encountered during the assembling/disassembling of the shielding plate in the art is avoided.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
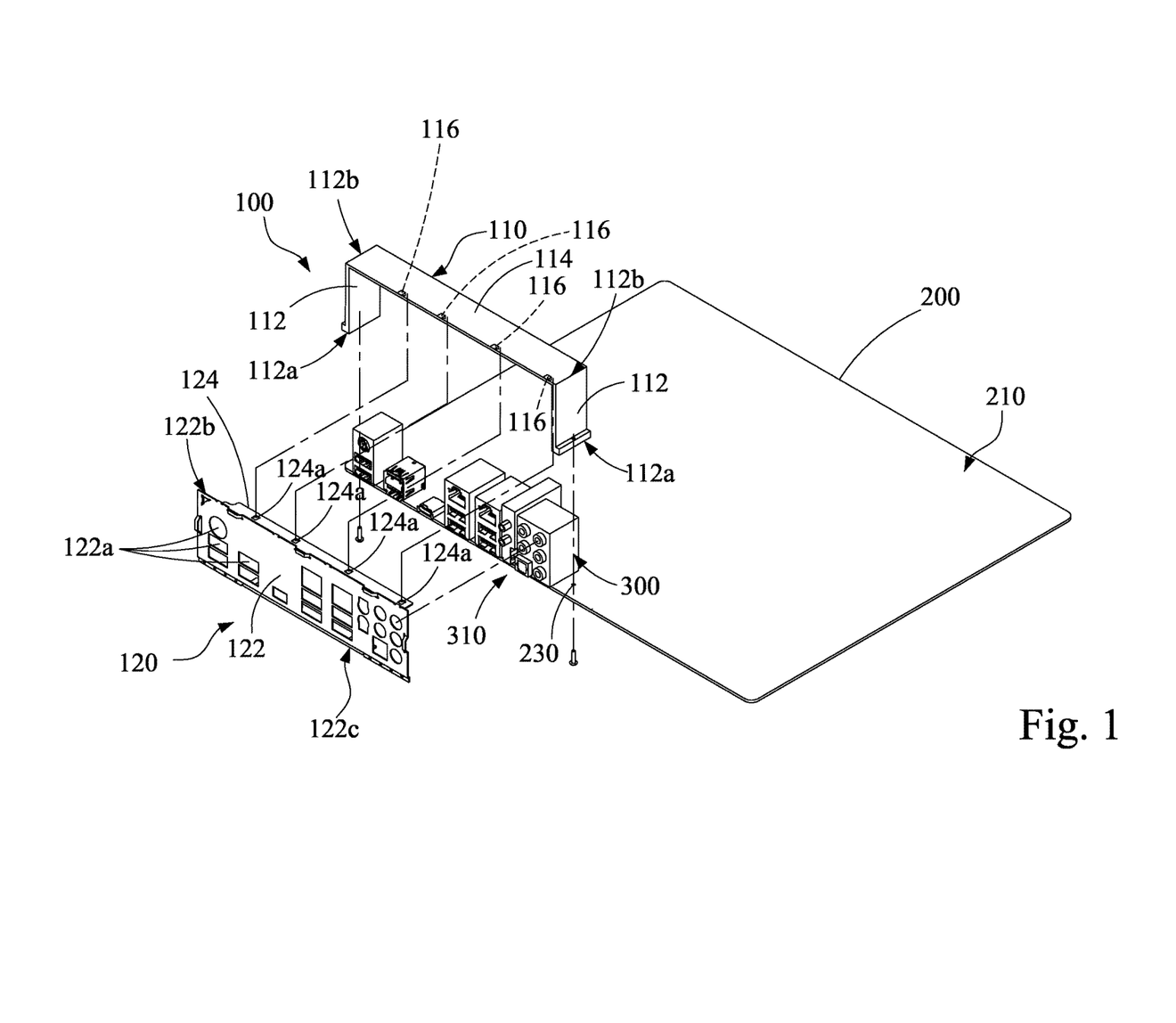
FIG. 1 illustrates an exploded view of an apparatus for covering connection port assembly according to a first embodiment of the instant disclosure.
Figure 2:
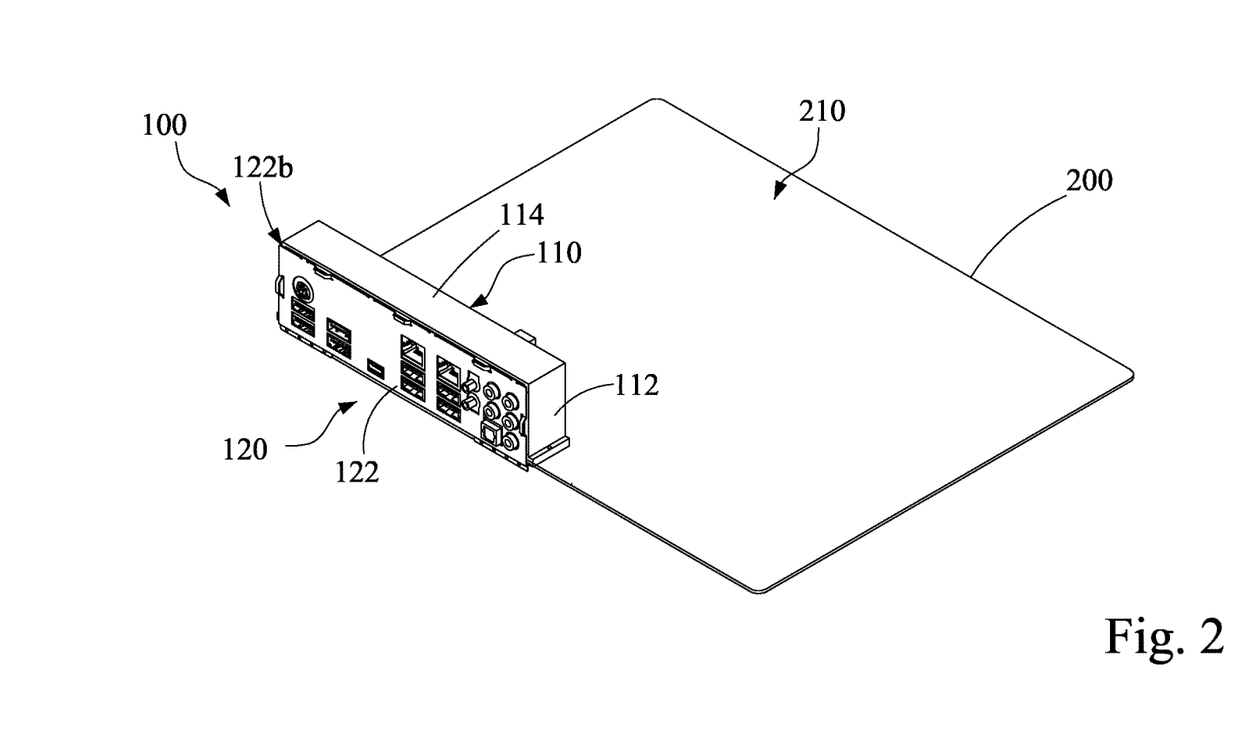
FIG. 2 illustrates a perspective view of the apparatus of the first embodiment.

Please refer to FIGS. 1 and 2, illustrating an apparatus for covering connection port assembly 100 according to a first embodiment of the instant disclosure. The apparatus is disposed on a motherboard 200 for covering a connection port assembly 300. The motherboard 200 has a top surface 210 and a bottom surface 220. The connection port assembly 300 has a signal connection surface 310. The connection port assembly 300 is disposed on an edge of the top surface 210 of the motherboard 200, and the signal connection surface 310 faces outwardly in a horizontal direction of the motherboard 200.

As shown in FIGS. 1 and 2, the apparatus 100 comprises a door frame 110 and a shielding plate 120. The door frame 110 is disposed on the motherboard 200, and the door frame 110 comprises two support members 112, a connecting member 114, and a plurality of latches 116.

As shown in FIGS. 1 and 2, each of the support members 112 has a fixed end 112a and a connecting end 112b. The fixed ends 112a are fixed on the top surface 210 of the motherboard 200 and correspond to two lateral edges of the signal connection surface 310, so that the connection port assembly 300 is located between the two support members 112.

The connecting portion 114 is connected to the connecting ends 112b of the two support members 112. The two support members 112, the connecting member 114, and the motherboard 200 define an accommodating area at an edge portion of the motherboard 200, and the connection port assembly 300 is located within the accommodating area.

As shown in FIGS. 1 and 2, the latch 116 is disposed on the connecting member 114. The shielding plate 120 comprises a plate body 122 and an upper flange 124. The plate body 122 is for covering the signal connection surface 310 of the connection port assembly 300. The plate body 122 has at least one opening 122a, an upper edge 122b, and a lower edge 122c. At least part of the signal connection surface 310 is exposed via the opening 122a. The configuration and the number of the opening 122a are depended on the configuration of the connection ports. For example, one single opening 122a corresponds to several connection ports at once, or one single opening 122a corresponds to one single connection port. The lower edge 122c corresponds to the edge portion of the motherboard 200. The upper flange 124 is extending from the upper edge 122b. The upper flange 124 has a latch hole 124a, and the latch 116 of the connecting member 114 is engaged into the latch hole 124a. Therefore, the shielding plate 120 is fixed to keep covering the signal connection surface 310.

In the first embodiment, the latch 16 is located on a lower surface of the connecting member 114 and located within the accommodating area. In the first embodiment, the fixed ends 112a are fixed on the motherboard 200 via screws. The screws pass through the through holes 230 of the motherboard 200 from the bottom side of the motherboard 200 and are engaged into the fixed ends 112a. It is understood that the screws are not limited for the fixation of the fixed ends 112a. In another embodiment, the fixed ends 112a may have flexible buckling members for engaging into the through holes 230, or the fixed ends 112a may be fixed on the motherboard 200 via adhesives.

In the first embodiment, the lower edge 122c corresponds to the edge portion of the motherboard 200, and the lower edge 122c is approximately flush with the edge portion of the motherboard 200. The upper edge 122b is flush with the lower surface of the connecting member 114, and the upper flange 124 is extending from the upper edge 122b and toward the accommodating area. The latch 116 of the connecting member 114 is engaged into the latch hole 124a, so that the upper flange 124 is fixed on the lower surface of the connecting member 114, and the shielding plate 120 is fixed on the door frame 110.

Figure 3:
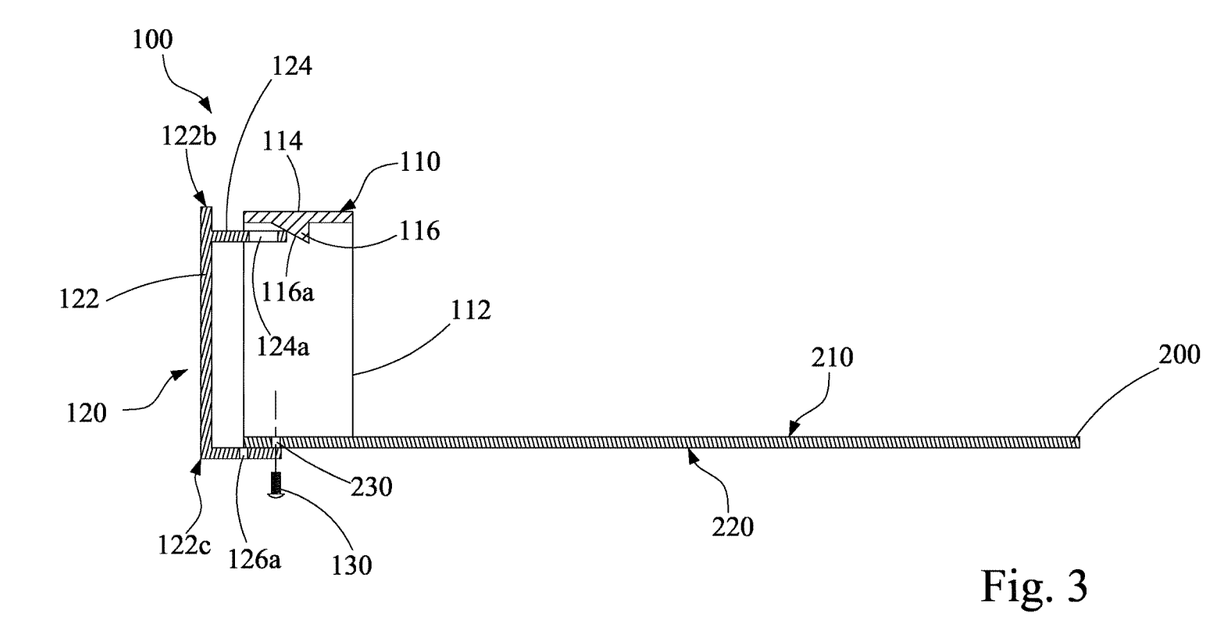
FIGS. 3 and 4 illustrate sectional views of parts of the components shown in FIG. 2.
Figure 4:
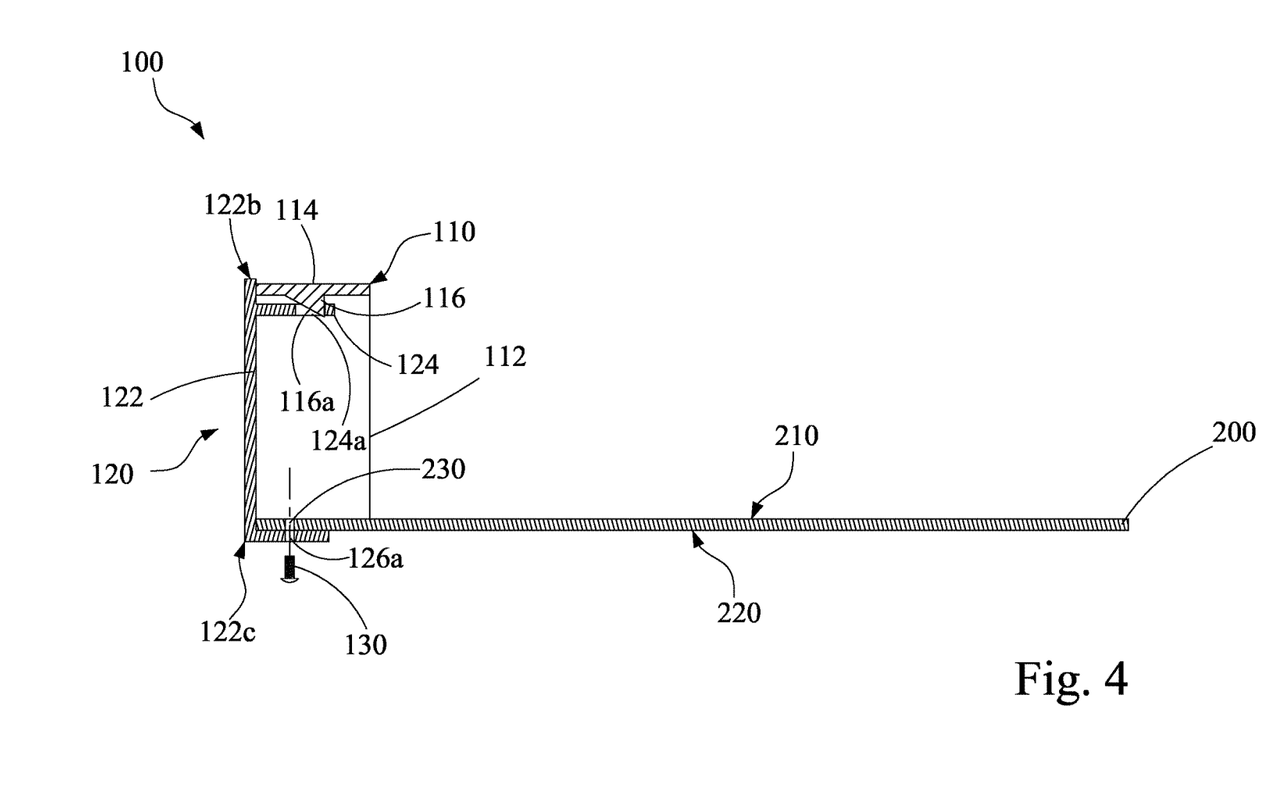

As shown in FIGS. 3 and 4, in one embodiment, the latch 116 is an engaging block. The engaging block has a guiding bevel 116a facing outwardly.

As shown in FIGS. 3 and 4, the guiding bevel 116a can be used for abutting against and guiding the upper flange 124. Therefore, during assembling the shielding plate 2, the front end of the upper flange 124 may be deformed properly to across the latch 116, so that the latch 116 is received in the latch hole 124a to fix the upper flange 124.

Figure 5:
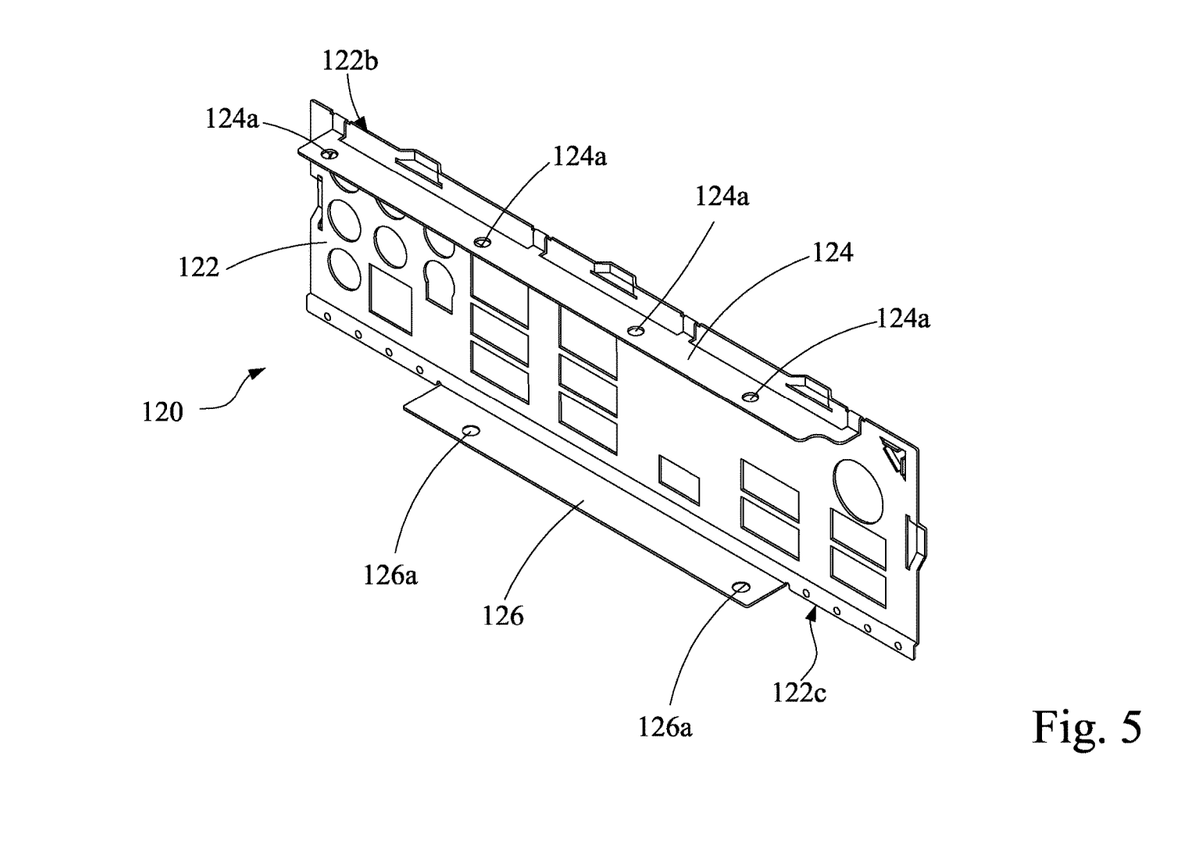
FIG. 5 illustrates a back perspective view of a shielding plate of the apparatus of the first embodiment.

As shown in FIGS. 3 to 5, furthermore, the shielding plate 120 further has a lower flange 126, and the lower flange 126 is extending from the lower edge 122c of the shielding plate 120. The lower flange 126 is fixed on the motherboard 200 directly or indirectly. Therefore, the fixation of the shielding plate 120 can be further improved.

In the first embodiment, the lower flange 126 has at least one fixing hole 126a, the motherboard 200 has a through hole 230, and the through hole 230 corresponds to the fixing hole 126a. The apparatus 100 further comprises a fixing member 130. The fixing member 130 passes through the fixing hole 126a of the lower flange 126 and the through hole 230 of the motherboard 200, so that the fixing member 130 fixes the lower flange 126 on the top surface 210 or the bottom surface 220 of the motherboard 200. The fixing member 130 may be a bolt, a screw, an expansion bolt, a push pin, etc. In one embodiment, the fixing member 130 may pass through the fixing hole 126a of the lower flange 126 and then be fixed on other structures on the motherboard 200. For instance, the fixing member 130 may be fixed on a separating pillar 140 disposed on the motherboard 200 or on other structural enhancement members on the motherboard 200.

Figure 6:
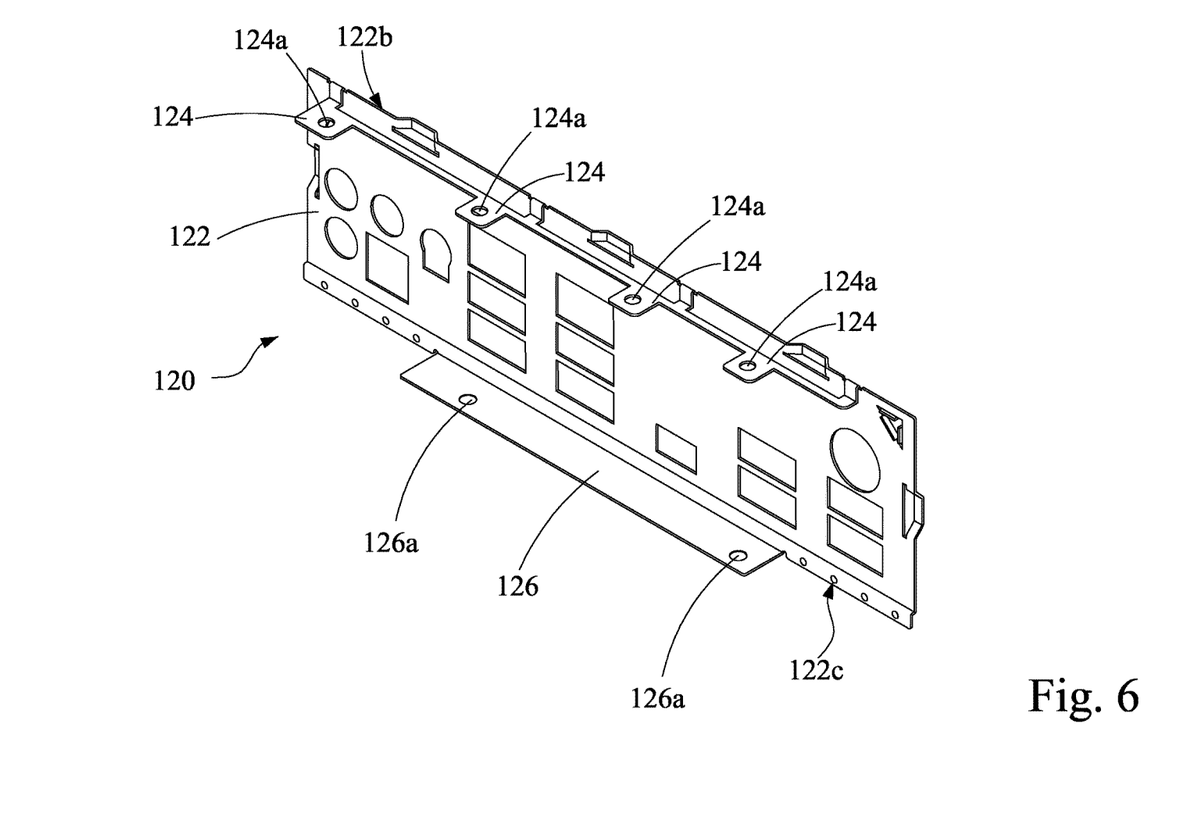
FIG. 6 illustrates a back perspective view of another example of the shielding plate of the apparatus of the first embodiment.

As shown in FIGS. 5 and 6, the upper flange 124 may be a unitary structure and have several latch holes 124a. In another embodiment, the upper flange 124 may be a multi-piece structure to form several bodies, and each body has a latch hole 124a.

Figure 7:
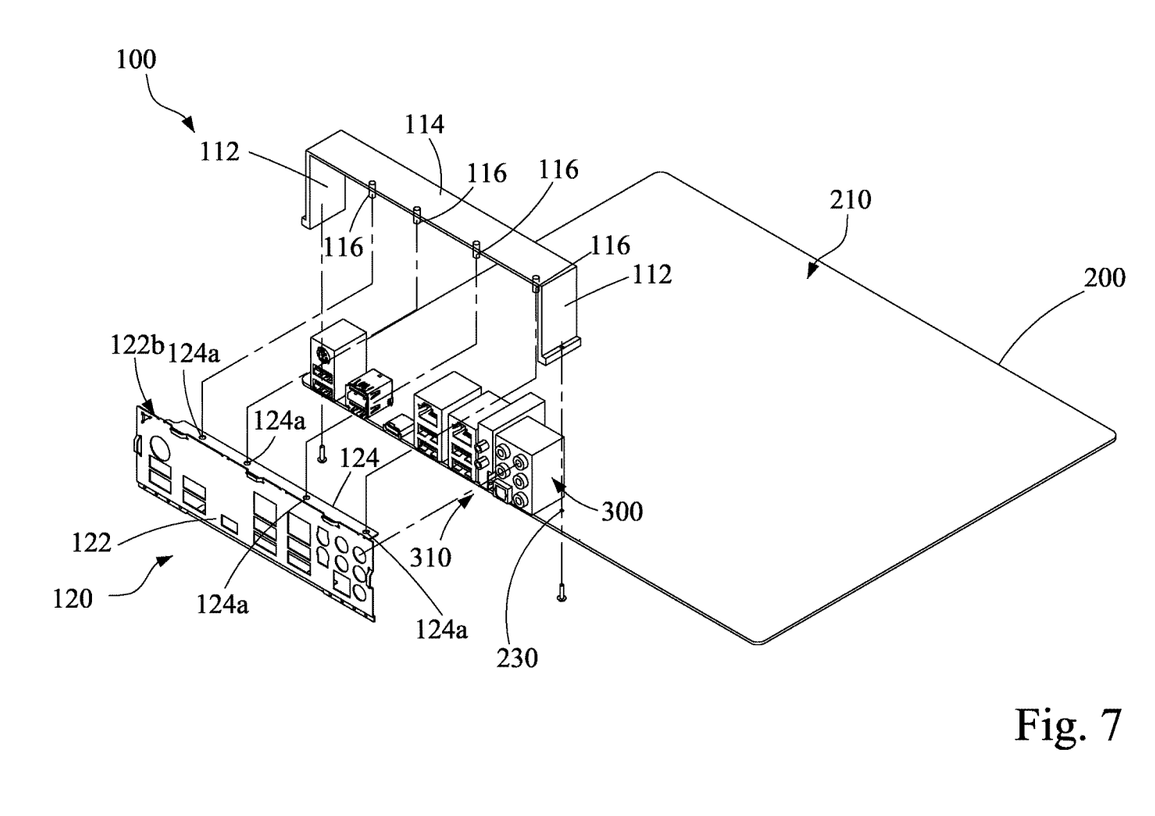
FIG. 7 illustrates another exploded view of the apparatus of the first embodiment where another embodiment of the latch is shown.
Figure 8:
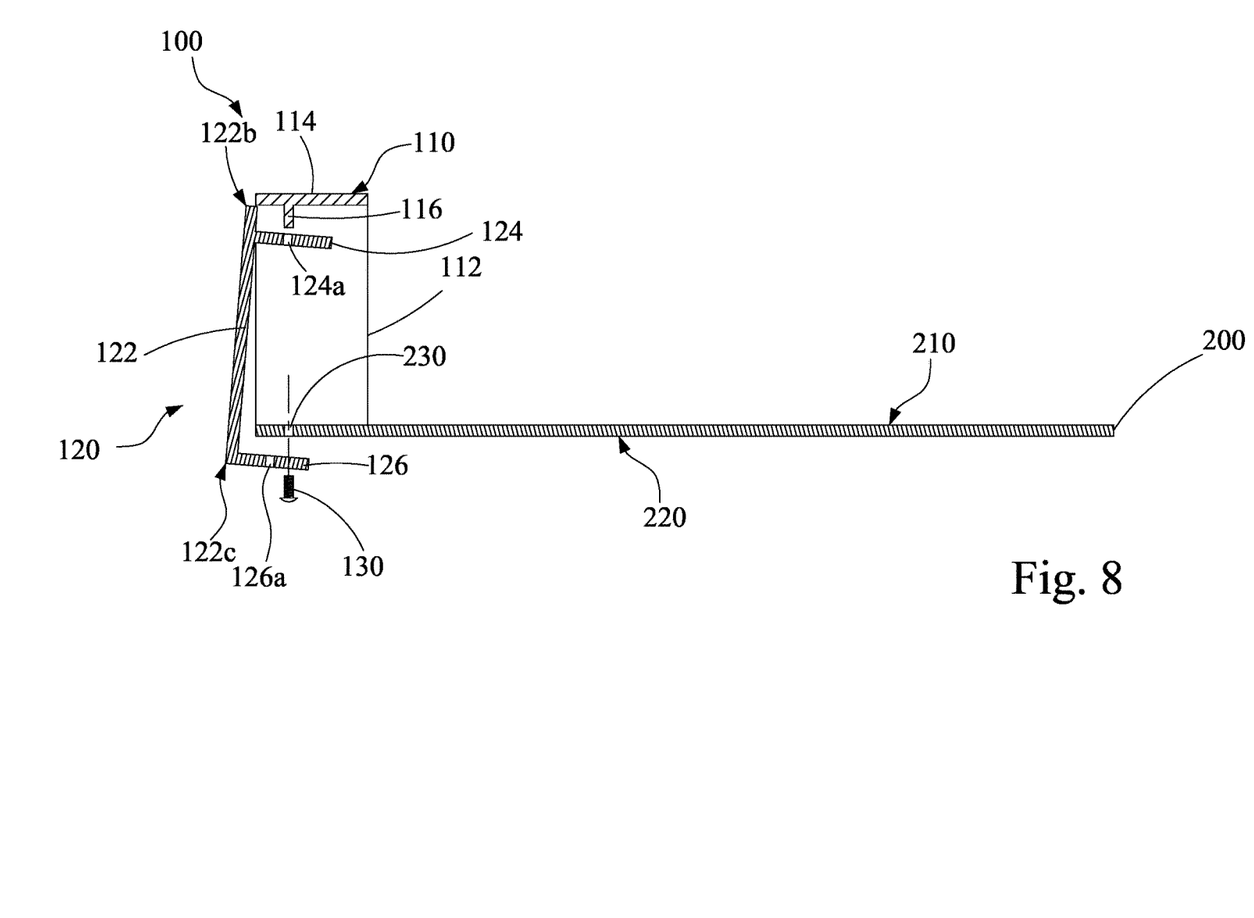
FIG. 8 illustrates a sectional view of parts of the components shown in FIG. 7.

As shown in FIGS. 7 and 8, the latch 116 may be a pillar and disposed on the lower surface of the connecting member 114. The cross-sectional profile of the pillar corresponds to the shape of the latch hole 124a. In assembling, the shielding plate 120 is aligned to be tilted relative to the signal connection surface 310, and the top edge portion of the shielding plate 120 is near the connecting member 114 of the door frame 110. Next, the pillar is inserted into the latch hole 124a. Last, the lower flange 126 is moved toward the motherboard 200, and the lower flange 126 is fixed on the top surface 210 or the bottom surface 220 of the motherboard 200.

Figure 9:
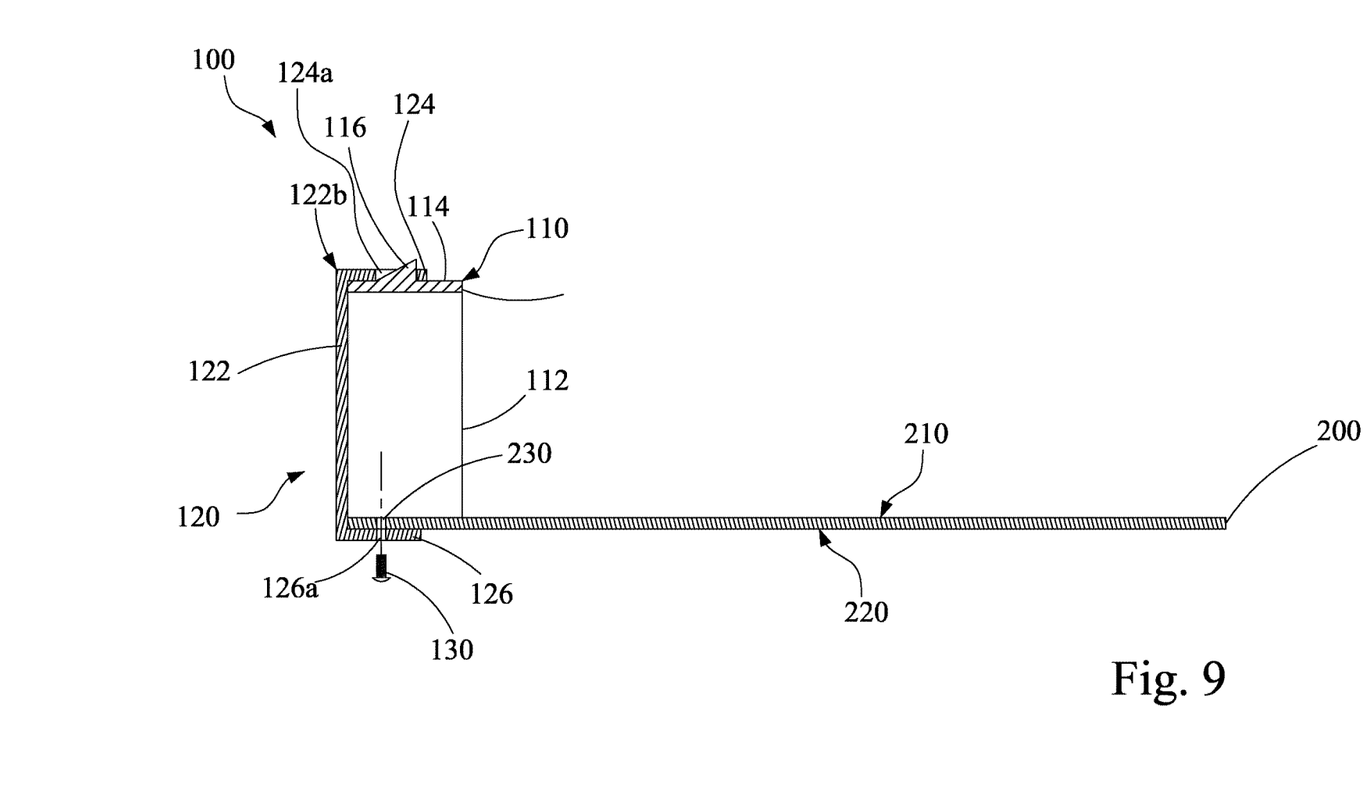
FIG. 9 illustrates a sectional view of parts of the components of an apparatus for covering connection port assembly according to a second embodiment of the instant disclosure.

Please refer to FIG. 9, illustrating an apparatus 100 for covering connection port assembly according to a second embodiment of the instant disclosure. In the second embodiment, the upper edge 122b of the shielding plate 120 is flush with the upper surface of the connecting member 114. The upper flange 124 is extending from the upper edge 122b and extending toward the upper surface of the connecting member 114. The latch 116 is disposed on the upper surface of the connecting member 114 for engaging into the latch hole 124a. Therefore, the upper flange 124 is fixed on the upper surface of the connecting member 114 via the latch 116 and the latch hole 124a, so that the shielding plate 120 is fixed on the door frame 110.

Figure 10:
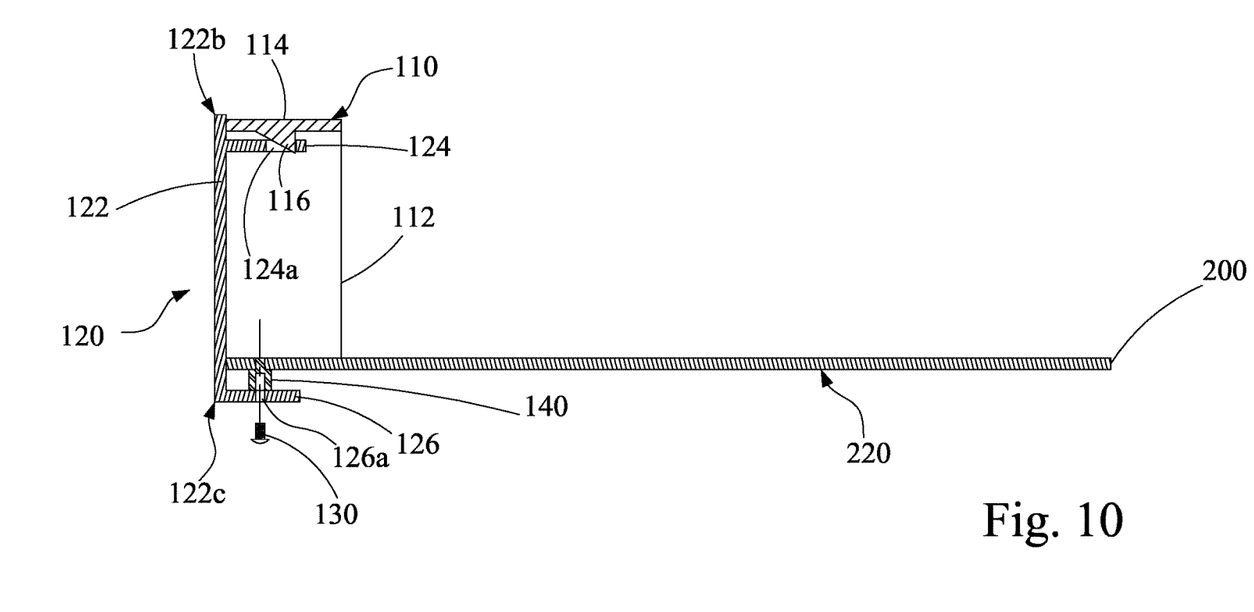
FIG. 10 illustrates a sectional view of parts of the components of an apparatus for covering connection port assembly according to a third embodiment of the instant disclosure.

Please refer to FIG. 10, illustrating an apparatus 100 for covering connection port assembly according to a third embodiment of the instant disclosure. In the third embodiment, the apparatus 100 further comprises a separating pillar 140. The separating pillar 140 may be a copper pillar or a plastic insulating pillar. The separating pillar 140 is disposed on the bottom surface 220 of the motherboard 200. The fixing member 130 passes through the fixing hole 126a of the lower flange 126 and is fixed on the top of the separating pillar 140. Therefore, the fixing member 130 indirectly fixes the lower flange 126 on the bottom surface 220 of the motherboard 200 via the separating pillar 140.

Figure 11:
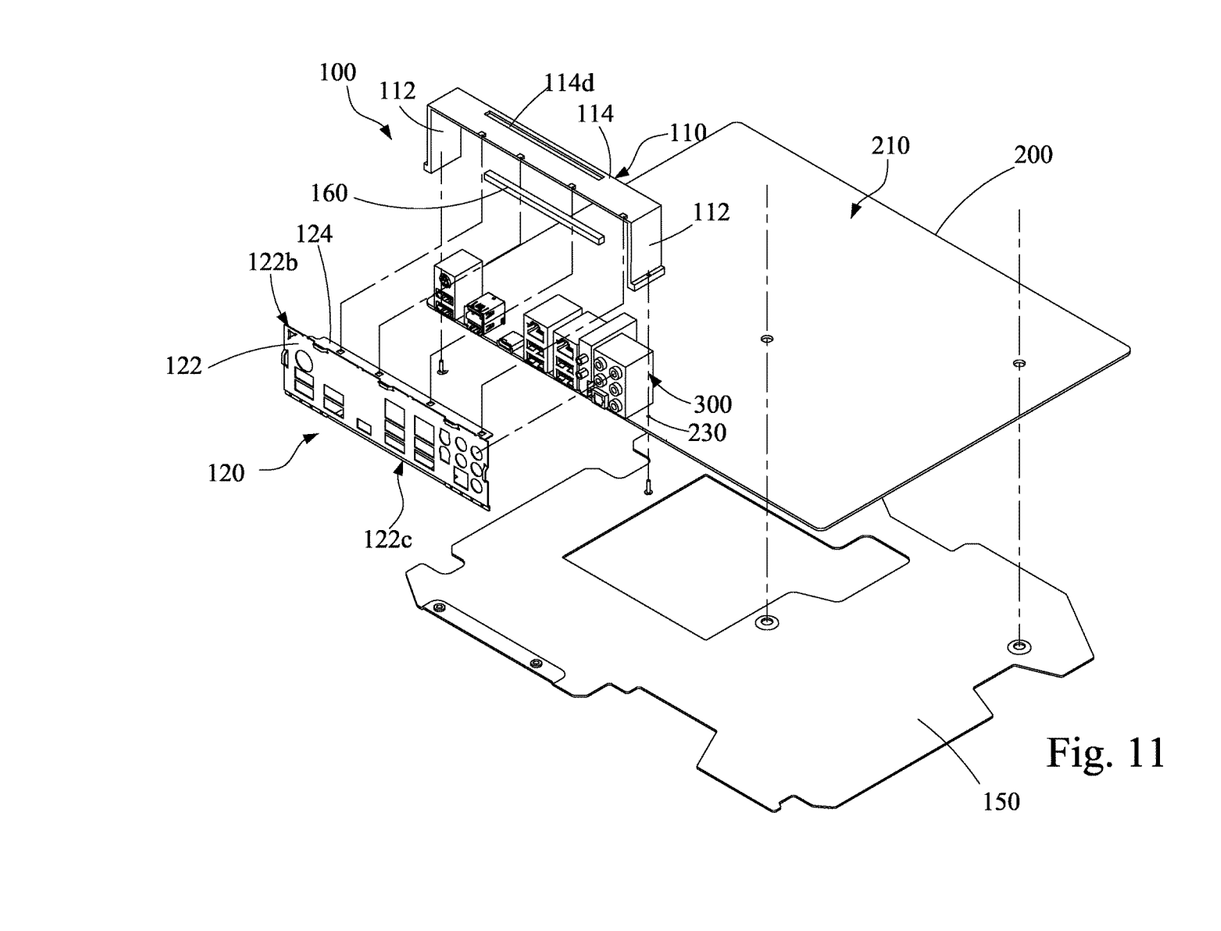
FIG. 11 illustrates an exploded view of an apparatus for covering connection port assembly according to a fourth embodiment of the instant disclosure.
Figure 12:
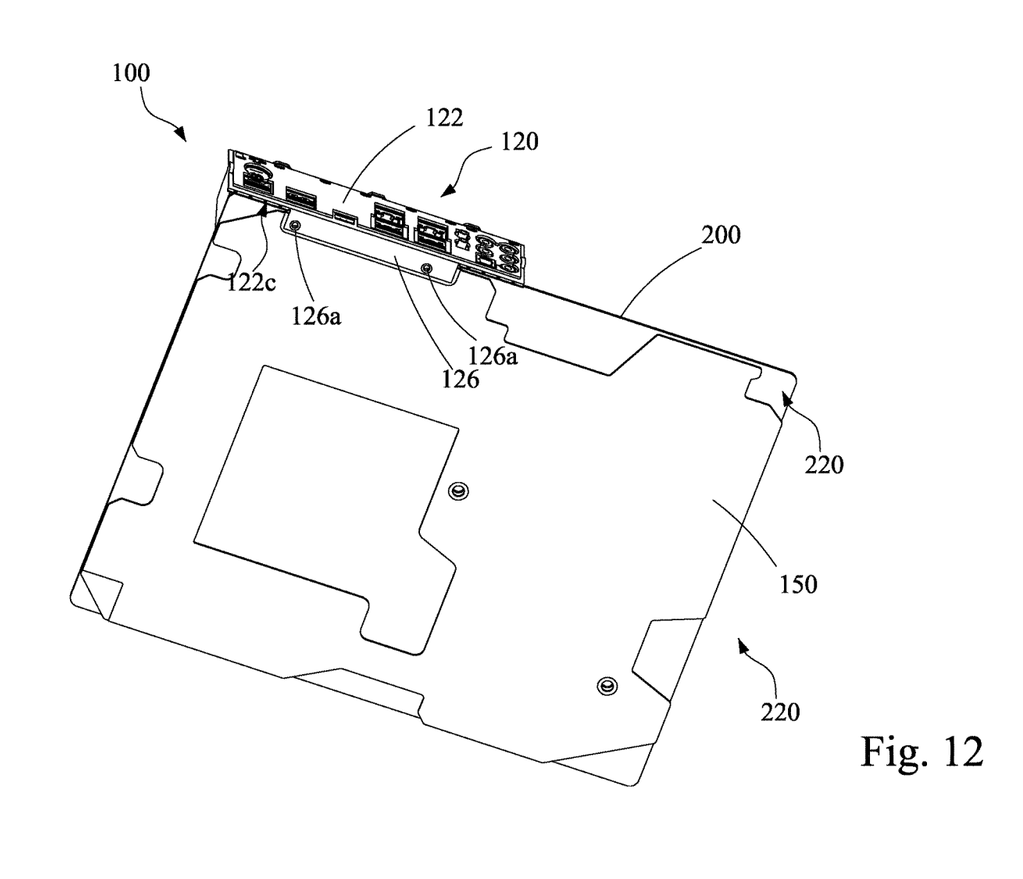
FIG. 12 illustrates a perspective view of the apparatus of the fourth embodiment.

Please refer to FIGS. 11 and 12, illustrating an apparatus 100 for covering connection port assembly according to a fourth embodiment of the instant disclosure. In this embodiment, the apparatus 100 further comprises a reinforcing plate 150. The reinforcing plate 150 is fixed on the bottom surface 220 of the motherboard 200 for enhancing the structural strength of the motherboard 200. The reinforcing plate 150 may provide additional protection, e.g., electromagnetic interference (EMI) protection or facilitating in heat dissipation.

As shown in FIG. 12, the lower flange 126 is fixed on the reinforcing plate 150. Therefore, the lower flange 126 is fixed on the bottom surface 220 of the motherboard 200 via the reinforcing plate 150.

As shown in FIG. 11, in this embodiment, the apparatus 100 further comprises a light source 160. The light source 160 may be an LED light bar or a luminescent light bar. The connecting member 114 has at least one window portion 114d. The window portion 114d may be a hollowed portion or may be a light-permeable sheet. The light source 160 is disposed on the lower surface of the connecting member 114 and corresponds to the window portion 114d. Hence, light beams from the light source 160 may be emitted at the connecting member 114 for further instruction or decorating purposes.

According to embodiments of the instant disclosure, the apparatus 100 for covering connection port assembly can be directly integrated onto the motherboard 200 without an additional separated I/O shielding plate. In other words, openings are reserved for the backboard of the computer chassis and no additional shielding plate is required. After the assembling of the motherboard 200, the apparatus 100 equipped to the motherboard 200 provides the shielding plate 120 for the computer chassis. Therefore, the problem encountered during the assembling/disassembling of the conventional shielding plate may be avoided.

The invention claimed is:

1. An apparatus for covering connection port assembly, disposed on a motherboard for covering a connection port assembly on the motherboard, the motherboard having a top surface and a bottom surface, the connection port assembly having a signal connection surface, the connection port assembly disposed on an edge of the top surface of the motherboard, and the signal connection surface facing outwardly in a horizontal direction of the motherboard, the apparatus for covering connection port assembly comprising:
    a door frame disposed on the motherboard, the door frame comprising:
        two support members, each having a fixed end and a connecting end, wherein the fixed ends of the two support members are fixed on the top surface of the motherboard and correspond to two lateral edges of the signal connection surface, so that the connection port assembly is located between the two support members;
        a connecting member connected to the connecting ends of the two support members, wherein the two support members, the connecting member, and the motherboard define an accommodating area at an edge portion of the motherboard, and the connection port assembly is located within the accommodating area; and
        at least one latch disposed on the connecting member; and
    a shielding plate, comprising:
        a plate body for covering the signal connection surface, wherein the plate body has at least one opening, an upper edge, and a lower edge, at least part of the signal connection surface is exposed via the opening, the lower edge corresponds to the edge portion of the motherboard; and
        an upper flange extending from the upper edge, wherein the upper flange comprises a latch hole, and the latch is engaged into the latch hole.

2. The apparatus according to claim 1, wherein the latch is on a lower surface of the connecting member, the upper edge is flush with the lower surface of the connecting member, the upper flange is extending toward the accommodating area, and the upper flange is fixed on the lower surface of the connecting member via the latch and the latch hole.

3. The apparatus according to claim 1, wherein the latch is on an upper surface of the connecting member, the upper edge is flush with the upper surface of the connecting member, the upper flange is extending from the upper surface of the connecting member, and the upper flange is fixed on the upper surface of the connecting member via the latch and the latch hole.

4. The apparatus according to claim 1, wherein the latch is an engaging block having a guiding bevel facing outwardly.

5. The apparatus according to claim 1, wherein the latch is a pillar for inserting into the latch hole.

6. The apparatus according to claim 1, wherein the shielding plate further has a lower flange extending from the lower edge, and the lower flange is fixed on the motherboard directly or indirectly.

7. The apparatus according to claim 6, wherein the lower flange has at least one fixing hole, the motherboard has a through hole corresponding to the fixing hole, the apparatus further comprises a fixing member, the fixing member passes through the fixing hole of the lower flange and the through hole of the motherboard to fix the lower flange on the bottom surface or the top surface of the motherboard.

8. The apparatus according to claim 6, wherein the lower flange has at least one fixing hole, the apparatus further comprises a fixing member and a separating pillar, the separating pillar is disposed on the bottom surface of the motherboard, the fixing member passes through the fixing hole of the lower flange to be fixed on the separating pillar, so that the fixing member indirectly fixes the lower flange on the bottom surface of the motherboard.

9. The apparatus according to claim 6, wherein the lower flange has at least one fixing hole, the apparatus further comprises a fixing member and a reinforcing plate, the reinforcing plate is fixed on the bottom surface of the motherboard, the fixing member passes the fixing hole of the lower flange to be fixed on the reinforcing plate, so that the fixing member indirectly fixes the lower flange on the bottom surface of the motherboard.

10. The apparatus according to claim 1, wherein the connecting member has a window portion, the apparatus further comprises a light source, the light source is disposed on a lower surface of the connecting member and corresponds to the window portion.

\* \* \* \* \*